(12) United States Patent
Van Dongen et al.

(10) Patent No.: US 12,730,386 B2
(45) Date of Patent: Sep. 8, 2026

(54) GRIPPER AND LITHOGRAPHIC APPARATUS COMPRISING THE GRIPPER

(71) Applicant: ASML NETHERLANDS B.V., Veldhoven (NL)

(72) Inventors: Paul Van Dongen, Wilton, CT (US); Aart Adrianus Van Beuzekom, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 119 days.

(21) Appl. No.: 18/252,491

(22) PCT Filed: Dec. 13, 2021

(86) PCT No.: PCT/EP2021/085443
§ 371 (c)(1),
(2) Date: May 10, 2023

(87) PCT Pub. No.: WO2022/148607
PCT Pub. Date: Jul. 14, 2022

(65) Prior Publication Data

US 2024/0019790 A1 Jan. 18, 2024

(30) Foreign Application Priority Data

Jan. 11, 2021 (EP) .................................... 21150851

(51) Int. Cl.

| | |
|---|---|
| ***G03F 7/00*** | (2006.01) |
| ***H10P 72/76*** | (2026.01) |
| ***H10P 72/78*** | (2026.01) |

(52) U.S. Cl.
CPC ........ *G03F 7/7075* (2013.01); *G03F 7/70341* (2013.01); *G03F 7/70916* (2013.01); *H10P 72/7602* (2026.01); *H10P 72/78* (2026.01)

(58) Field of Classification Search
CPC ............ G03F 7/70341; G03F 7/70733; G03F 7/7075; G03F 7/70916; H01L 21/6838; H01L 21/68707
See application file for complete search history.

(56) References Cited

U.S. PATENT DOCUMENTS

| | | | |
|---|---|---|---|
| 5,980,194 | A | 11/1999 | Freerks et al. |
| 6,322,116 | B1 | 11/2001 | Stevens |

(Continued)

FOREIGN PATENT DOCUMENTS

| | | |
|---|---|---|
| EP | 1420298 | 5/2004 |
| JP | H05-291375 | 11/1993 |

(Continued)

OTHER PUBLICATIONS

International Search Report dated Apr. 19, 2022, issued in corresponding PCT Patent Application No. PCT/EP2021/085443 (3 pgs.).

(Continued)

*Primary Examiner* — Deoram Persaud
(74) *Attorney, Agent, or Firm* — Pillsbury Winthrop Shaw Pittman, LLP

(57) ABSTRACT

A gripper configured to transport a substrate in a lithographic apparatus, the gripper including: a main body with one or more engagement portions for engaging with a surface of the substrate, wherein a part of the main body, that is overlapped by a region of a substrate when the one or more engagement portions are engaged with the substrate, has a plurality of openings that extend through the main body in a direction substantially perpendicular to the surface of the substrate.

21 Claims, 8 Drawing Sheets

(56) References Cited

U.S. PATENT DOCUMENTS

| | | | | |
|---|---|---|---|---|
| 6,952,253 | B2 | 10/2005 | Lof et al. | |
| 8,672,602 | B2 * | 3/2014 | Asari | H10P 72/7602 414/160 |
| 11,935,778 | B2 * | 3/2024 | Kakinuma | H10P 72/78 |
| 12,191,188 | B2 * | 1/2025 | Amikura | H10P 72/7602 |
| 2001/0020763 | A1 | 9/2001 | Tokunaga | |
| 2003/0219914 | A1 | 11/2003 | Gaudon et al. | |
| 2003/0234548 | A1 * | 12/2003 | Aggarwal | B25B 11/007 294/188 |
| 2004/0207824 | A1 | 10/2004 | Lof et al. | |
| 2005/0006916 | A1 * | 1/2005 | Mantz | H01L 21/68707 414/941 |
| 2007/0195297 | A1 | 8/2007 | Nakaharada et al. | |
| 2008/0107508 | A1 | 5/2008 | Chan | |
| 2009/0096229 | A1 * | 4/2009 | Bonora | H10P 72/78 414/222.01 |
| 2010/0045949 | A1 | 2/2010 | Nakano et al. | |
| 2011/0266736 | A1 | 11/2011 | Lewis et al. | |
| 2014/0261539 | A1 | 9/2014 | Chen et al. | |
| 2014/0265393 | A1 * | 9/2014 | Pergande | B25J 15/0014 294/81.5 |
| 2015/0086316 | A1 * | 3/2015 | Greenberg | B25J 15/0052 414/800 |
| 2016/0346897 | A1 | 12/2016 | Reedy et al. | |
| 2017/0108781 | A1 | 4/2017 | Van Beuzekom et al. | |
| 2017/0144313 | A1 * | 5/2017 | Sakai | B25J 15/0014 |
| 2020/0161156 | A1 | 5/2020 | Qiao et al. | |
| 2023/0121922 | A1 * | 4/2023 | Kramer | G03F 7/70733 355/72 |

FOREIGN PATENT DOCUMENTS

| | | |
|---|---|---|
| JP | H08-17895 | 1/1996 |
| JP | 11-111803 | 4/1999 |
| JP | 2007525001 | 8/2007 |
| JP | 2012082071 | 4/2012 |
| JP | 2016533636 | 10/2016 |
| JP | 2017098405 | 6/2017 |
| KR | 1020190139537 | 12/2019 |
| KR | 10-2020-0033788 | 3/2020 |
| KR | 10-2020-0043341 | 4/2020 |
| KR | 10-2104487 | 4/2020 |
| WO | 2020/230125 | 11/2020 |
| WO | 2022/073679 | 4/2022 |

OTHER PUBLICATIONS

Written Opinion of the International Searching Authority dated Apr. 19, 2022, issued in corresponding PCT Patent Application No. PCT/EP2021/085443 (7 pgs.).

“Avoiding Wetting with Highly Asymmetric Warped Wafers”, Research Disclosure, Kenneth Mason Publications, Hampshire, UK, GB, vol. 681, No. 86, Dec. 21, 2020 (3 pgs.).

Office Action issued in corresponding Japanese Patent Application No. 2023-526970, dated Jan. 13, 2026.

Office Action issued in corresponding Japanese Patent Application No. 2023-526970, dated Jun. 16, 2026.

* cited by examiner

SO
4220
LA
4221
O
4210
IF
CO

GRIPPER AND LITHOGRAPHIC APPARATUS COMPRISING THE GRIPPER

CROSS-REFERENCE TO RELATED APPLICATIONS

This application is the U.S. national phase entry of PCT patent application no. PCT/EP2021/085443, which was filed Dec. 13, 2021, which claims the benefit of priority of European patent application no. 21150851.0, which was filed on Jan. 11, 2021, and which is incorporated herein in its entirety by reference.

FIELD

The present invention relates to a gripper and a lithographic apparatus comprising the gripper.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as “design layout” or “design”) of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as “Moore’s law”. To keep up with Moore’s law the semiconductor industry is seeking technologies that make it possible to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Immersion techniques have been introduced into lithographic systems to enable improved resolution of smaller features. In an immersion lithographic apparatus, a liquid layer of immersion liquid having a relatively high refractive index is interposed in a space between a projection system of the apparatus (through which the patterned beam is projected towards the substrate) and the substrate. The immersion liquid covers at last the part of the substrate under a final element of the projection system. Thus, at least the portion of the substrate undergoing exposure is immersed in the liquid. The effect of the immersion liquid is to enable imaging of smaller features since the exposure radiation will have a shorter wavelength in the immersion liquid than gas. (The effect of the liquid may also be regarded as increasing the effective numerical aperture (NA) of the system and also increasing the depth of focus.)

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the space as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography. In this specification, reference will be made in the description to localized immersion in which the immersion liquid is confined, in use, to the space between the final element and a surface facing the final element. The facing surface is a surface of substrate or a surface of a support table (or a substrate support) that is co-planar with the surface of the substrate. (Please note that reference in the following text to surface of the substrate also refers in addition or in the alternative to a surface of the substrate support, unless expressly stated otherwise; and vice versa). A fluid handling structure present between the projection system and the stage is used to confine the immersion to the space. The space filled by immersion liquid is smaller in plan than the top surface of the substrate and the space remains substantially stationary relative to the projection system while the substrate and substrate stage move underneath.

SUMMARY

In an immersion lithographic apparatus, at least part of the surface of a substrate is immersed in a liquid. After the immersion process has been completed, it may be important to substantially minimize the amount of the liquid that remains on the substrate surface. Residual droplets of liquid may, for example, affect the thermal properties of the substrate and/or other substrates that the liquid may be transferred to.

A gripper may be provided, driven for example by a robotic arm, for moving a substrate within the lithographic apparatus. For example, the gripper may be used to move a substrate from a thermal conditioning table to a substrate table for exposure. After an exposure process has been performed, the same gripper may be used to move the substrate from the substrate table to another location and then move other substrates.

A problem experienced by a known lithographic apparatus may be that residual liquid on a substrate is transferred to the gripper when the gripper moves the substrate. The gripper may then transfer some of the liquid to another substrate when moving the other substrate. The gripper may therefore undesirably transfer liquid onto a previously dry substrate. Such liquid transfer may result in a reduced yield from the previously dry substrate.

According to a first aspect of the invention, there is provided a gripper configured to transport a substrate in a lithographic apparatus, the gripper comprising: a main body with one or more engagement portions for engaging with a surface of the substrate; wherein a part of the main body, that is overlapped by a region of a substrate when the one or more engagement portions are engaged with the substrate, comprises a plurality of openings that extend through the main body in a direction substantially perpendicular to the surface of the substrate.

According to a second aspect of the invention, there is provided a gripper system comprising: a gripper according to the first aspect; and a suction module; wherein the suction module comprises a fluid extraction conduit configured to extract fluid from the surfaces of a part of the gripper.

According to a third aspect of the invention, there is provided a substrate handler comprising the gripper system according to the second aspect.

According to a fourth aspect of the invention, there is provided a lithographic apparatus comprising the substrate handler according to the third aspect.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
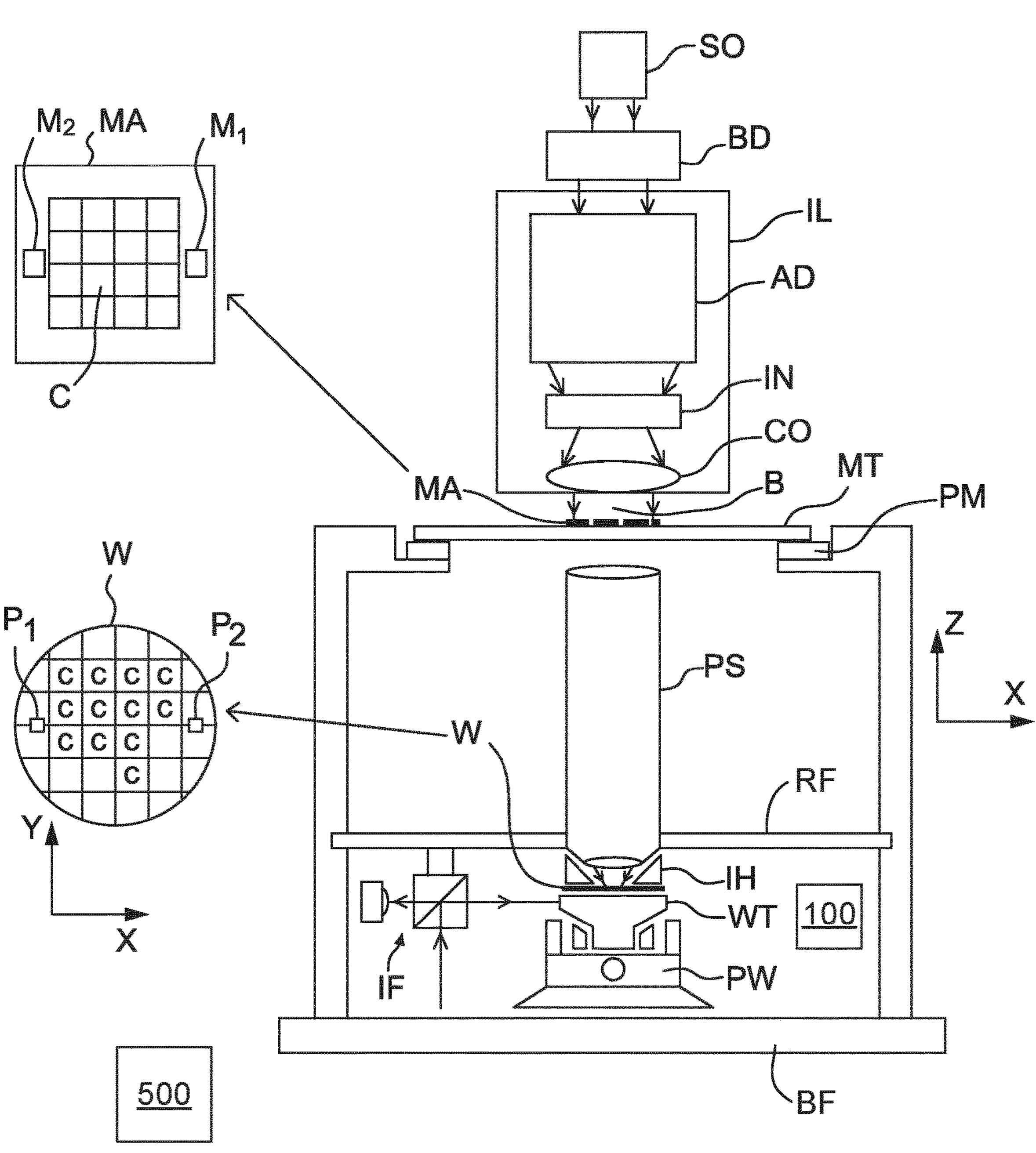
FIG. 1 depicts a lithographic apparatus according to an embodiment of the invention.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W. A controller 500 controls the overall operation of the apparatus. Controller 500 may be a centralised control system or a system of multiple separate sub-controllers within various sub-systems of the lithographic apparatus.

In operation, the illumination system IL receives a radiation beam from a source SO or radiation, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid. Any use of the term "projection lens" herein may be considered as synonymous with the more general term "projection system".

The lithographic apparatus may be of a type wherein at least a portion of the substrate W may be covered by an immersion liquid having a relatively high refractive index, e.g., water, so as to fill an immersion space between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate tables WT (also named "dual stage"). In such "multiple stage" machine, the substrate tables WT may be used in parallel, and/or steps in preparation of a subsequent exposure of the substrate W may be carried out on the substrate W located on one of the substrate table WT while another substrate W on the other substrate table WT is being used for exposing a pattern on the other substrate W.

In addition to the substrate table WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate table WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF (e.g. an interferometric device, linear encoder, 2-D encoder or capacitive sensor), the substrate table WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In this specification, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

A localized liquid supply system or fluid handling system is provided between the projection system PS and the substrate W. The liquid supply system is provided with a fluid handling structure IH (or liquid confinement structure), which extends along at least a part of a boundary of the space between the final element of the projection system PS and the support table WT or substrate W. The fluid handling structure IH is substantially stationary relative to the projection system PS in the XY plane though there may be some relative movement in the Z direction (in the direction of the optical axis). In an example, a seal is formed between the fluid handling structure IH and the surface of the substrate W and may be a contactless seal such as a gas seal (such a system with a gas seal is disclosed in EP1,420,298) or liquid seal.

The fluid handling structure IH at least partly confines the immersion liquid in the space between the final element of the projection system PS and the substrate W. The space is at least partly formed by the fluid handling structure IH positioned below and surrounding the final element of the projection system PS Immersion liquid is brought into the space below the projection system PS and within the fluid handling structure IH by one of liquid openings. The immersion liquid may be removed by another of liquid openings.

The immersion liquid may be confined in the space by a contactless seal such as a gas seal formed by a gas which, during use, is formed between the bottom of the fluid handling structure IH and the surface of the substrate W. The gas in the gas seal is provided under pressure via inlet to the gap between the fluid handling structure IH and substrate W. The gas is extracted via outlet. The overpressure on the gas inlet, vacuum level on the outlet and geometry of the gap are arranged so that there is a high-velocity gas flow inwardly that confines the immersion liquid. Such a system is disclosed in US 2004/0207824, which is hereby incorporated by reference in its entirety. In an example, the fluid handling structure IH does not have the gas seal.

Another example of a liquid supply system is disclosed in US 2010/0045949 A1, which is hereby incorporated by reference in its entirety.

Figure 2:
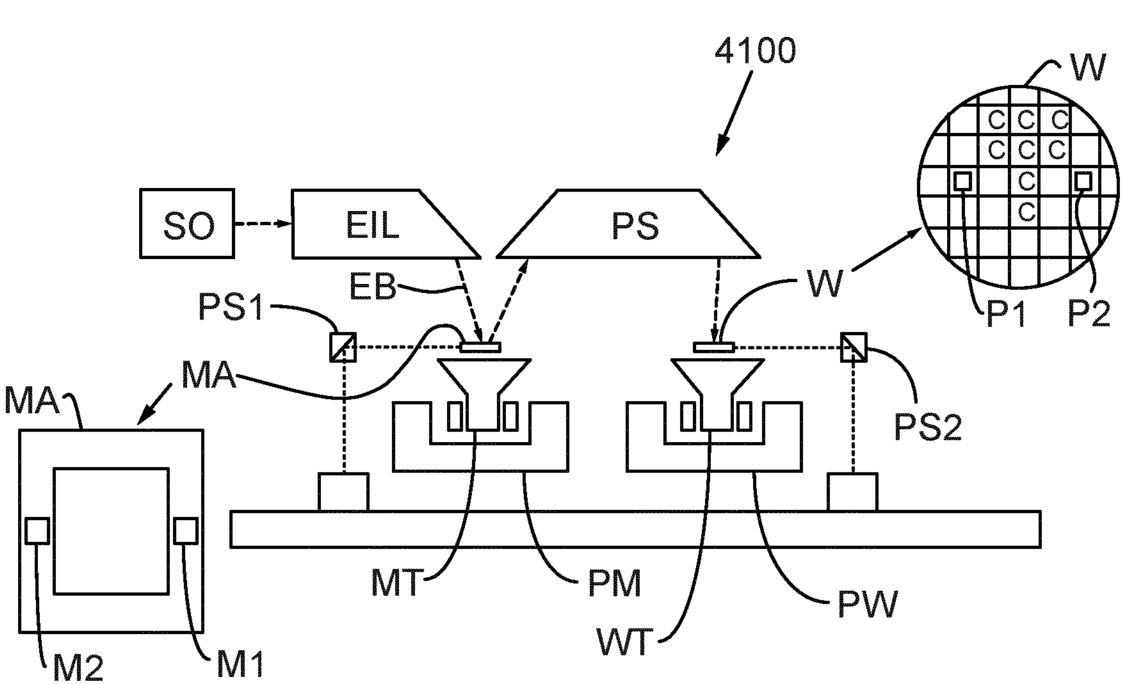
FIG. 2 depicts a lithographic apparatus according to an embodiment of the invention.

FIG. 2 schematically depicts an EUV lithographic apparatus 4100 including a source collector apparatus SO. The apparatus comprises:

- an illumination system (illuminator) EIL configured to condition a radiation beam B (e.g. EUV radiation);
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

These basic components of the EUV lithographic apparatus are similar in function to the corresponding components of the lithographic apparatus of FIG. 1. The description below mainly covers areas of difference and duplicative description of aspects of the components that are the same is omitted.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 2, the EUV illuminator EIL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used the same modes as the apparatus of FIG. 1.

Figures 3, 4:
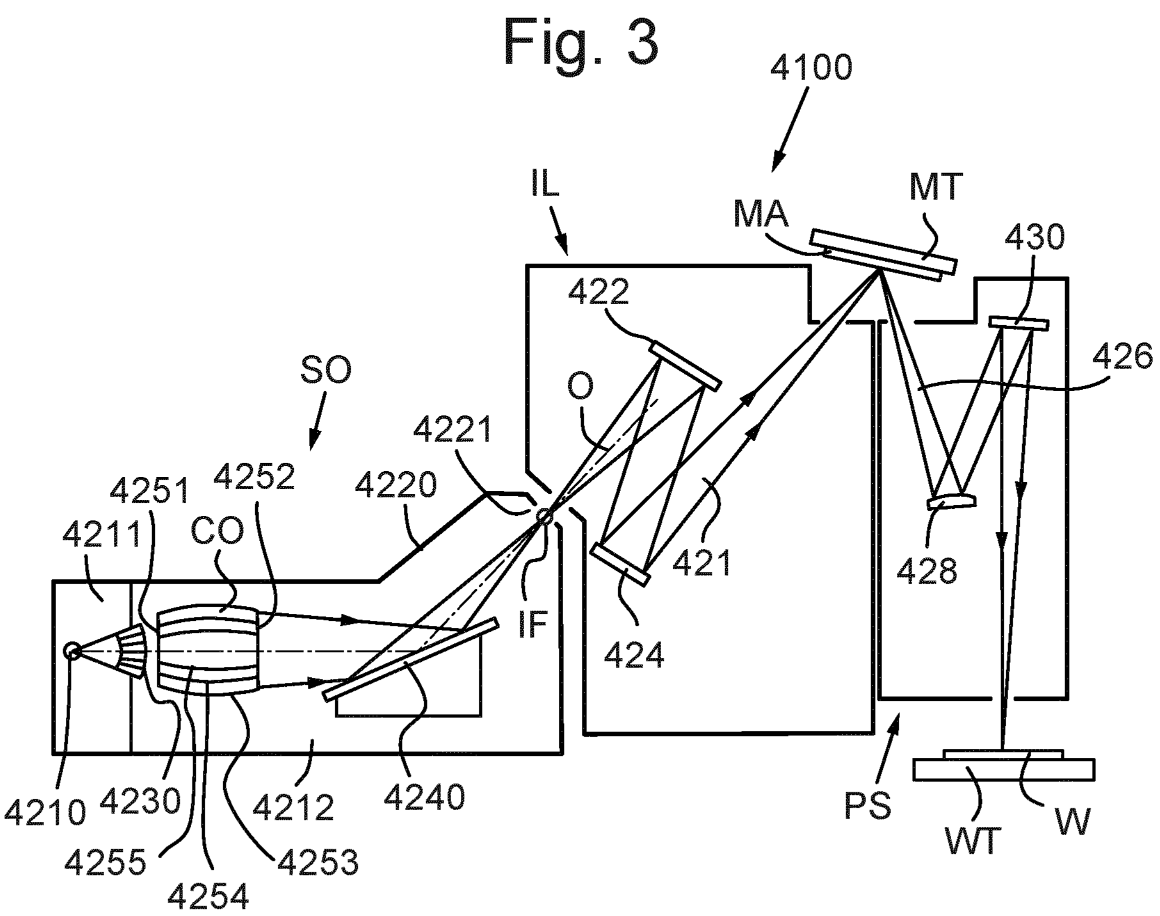
FIG. 3 is a more detailed view of the apparatus 4100.
FIG. 4 is a more detailed view of the source collector apparatus SO of the apparatus of FIGS. 2 and 3.

FIG. 3 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

Collector optic CO, as illustrated in FIG. 3, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Alternatively, the source collector apparatus SO may be part of an LPP radiation system as shown in FIG. 4. A laser LA is arranged to deposit laser energy into a fuel, such as xenon (Xe), tin (Sn) or lithium (Li), creating the highly ionized plasma 4210 with electron temperatures of several of eV. The energetic radiation generated during de-excitation and recombination of these ions is emitted from the plasma, collected by a near normal incidence collector optic CO and focused onto the opening 4221 in the enclosing structure 4220.

An embodiment of the present invention can be applied to any type of lithographic apparatus.

Figure 5:
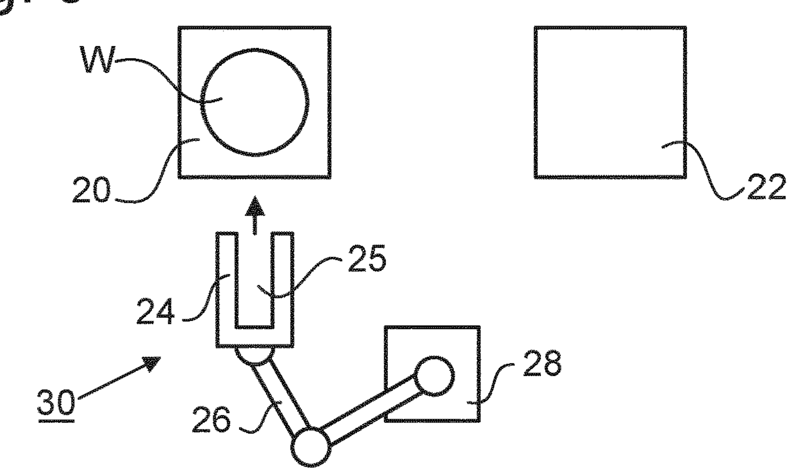
FIG. 5 depicts a prior art gripper being moved towards a position of engagement with a substrate on a thermal conditioning table.
Figure 6:
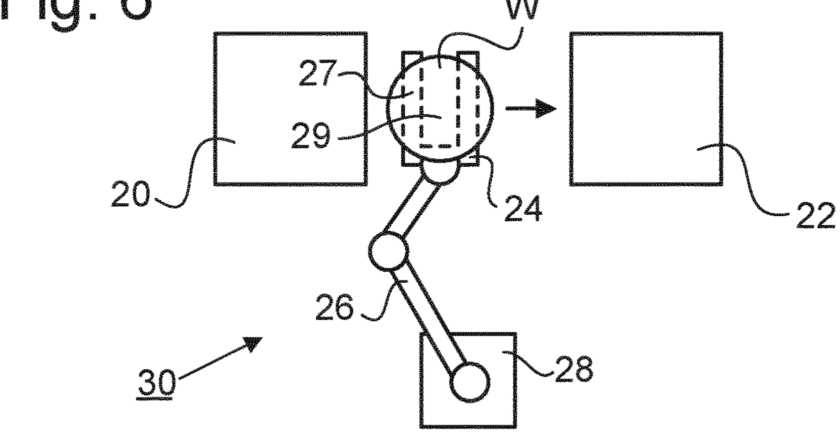
FIG. 6 depicts a substrate being transporting from a thermal conditioning table to a substrate table for exposure using the prior art gripper of FIG. 5.
Figure 7:
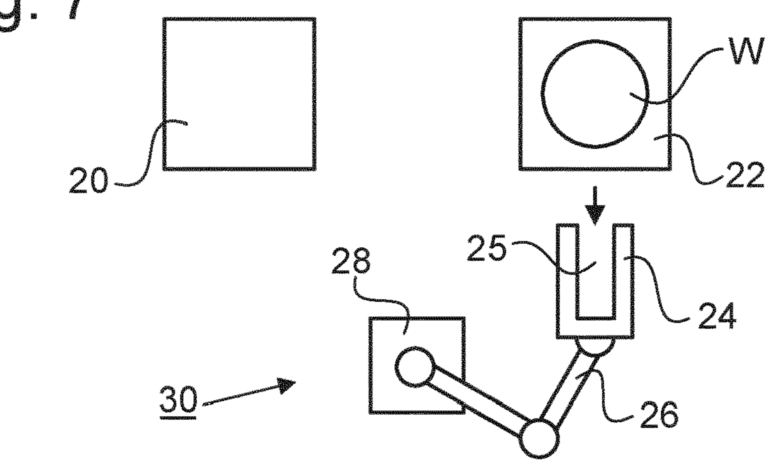
FIG. 7 depicts the prior art gripper of FIG. 6 being moved away after release of the substrate onto the substrate table for exposure.

FIGS. 5-7 depict use of a substrate transfer device 30 of the prior art for transferring a substrate from a thermal conditioning table 20 to a substrate table for exposure 22. The substrate transfer device 30 comprises a gripper 24, a robot arm 26, and a robot arm motor 28. FIG. 5 depicts the gripper 24 being moved by the robot arm 26 towards the substrate W on the thermal conditioning table 20. FIG. 6 depicts the gripper 24 transporting the gripped substrate W towards the substrate table for exposure 22. FIG. 7 depicts the gripper 24 being moved away from the substrate W after release of the substrate W onto the substrate table for exposure 22.

In the arrangement depicted the gripper 24 has a cut-out portion 25 to allow the gripper 24 to be slid underneath the substrate W past support pins used for supporting the substrate vertically above the thermal conditioning table 20. When the gripper 24 is in position beneath the substrate W, the gripper 24 is raised to disengage the substrate W from the thermal conditioning table 20. The substrate W can then be transported towards the substrate table for exposure 22, lowered down until the substrate W rests on support elements (e.g. support pins, not shown in figures) associated with the substrate table for exposure 22, thus releasing the substrate W from the gripper 24. The gripper 24 can then be removed as shown in FIG. 7.

As described in the introductory part of the description, in an immersion lithographic apparatus, at least part of the surface of a substrate W is immersed in a liquid. After the immersion process has been completed, it is important to minimize the residual amount of the liquid that remains on the substrate W surface. Residual droplets of liquid may, for example, affect the thermal properties of the substrate W and thereby reduce yield.

As described above, a gripper 24 of a substrate transfer device 30 may transfer a substrate W within the lithographic apparatus. For example, the gripper 24 may be used to move a substrate W from a thermal conditioning table to a substrate table for exposure. After an exposure process has been performed, the same gripper 24 may be used to move the substrate W from the substrate table to another location.

Figure 8:
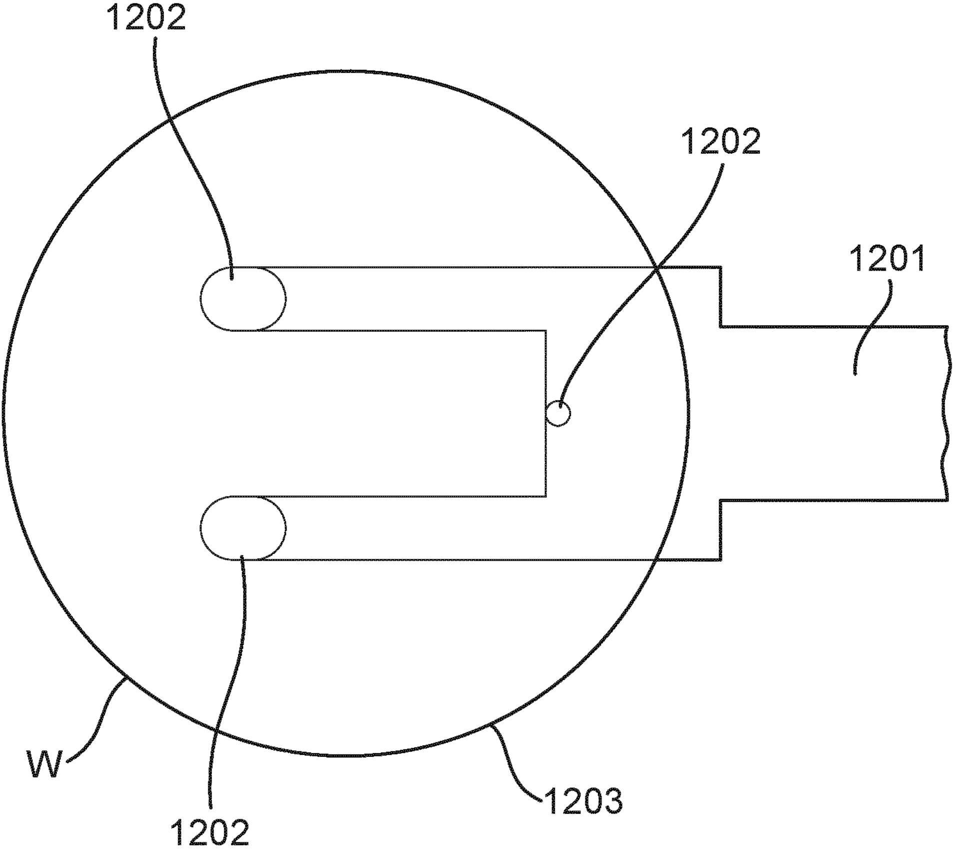
FIG. 8 shows, in plan view, a substrate that is secured to a gripper.

FIG. 8 shows, in plan view, a substrate W that is secured to a gripper 1201. The substrate W may be secured to the gripper 1201 by three engagement portions 1202. The engagement portions 1202 may be the only points of contact between the substrate W and the gripper 1201. The substrate W may be located above the gripper 1201 so that the engagement portions 1202 contact the lower surface of the substrate W. As a consequence of an immersion process that may have been performed on the substrate W, residual liquid, such as water droplets, may be present in a region of the substrate W. In particular, the residual liquid may be present in the edge/peripheral region 1203 of the substrate W.

A problem that may be experienced is that residual liquid on the substrate W is transferred to the gripper 1201. For example, although there may be no direct contact between the edge/peripheral region 1203 of substrate W and the gripper 1201, the liquid in the edge/peripheral region 1203 may fall from the substrate W onto the gripper 1201. Any liquid that is transferred to the gripper 1201, may then be transferred onto another substrate W secured to the gripper 1201. The gripper 1201 may therefore undesirably transfer liquid from a wet outgoing substrate W to a previously dry incoming substrate W. Such liquid transfer may result in a reduced yield from the incoming substrate W.

Embodiments provide techniques for reducing, or substantially preventing, the above-described problem of liquid transfer between different substrates W. Embodiments provide a new design of gripper of a substrate transfer device. When liquid is transferred from a substrate W to the gripper, the amount of liquid that is retained on the gripper may be lower than that with known techniques. This may reduce, or substantially prevent, the gripper from transferring liquid to another substrate W.

Figure 9A:
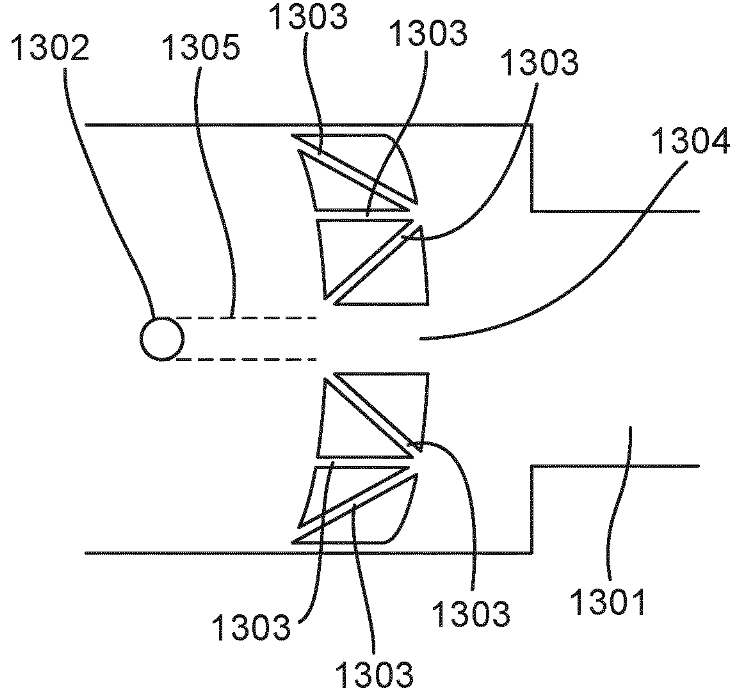
FIGS. 9A and 9B show, in plan view, part of a gripper 1301 according to implementations of a first embodiment.
Figure 9B:
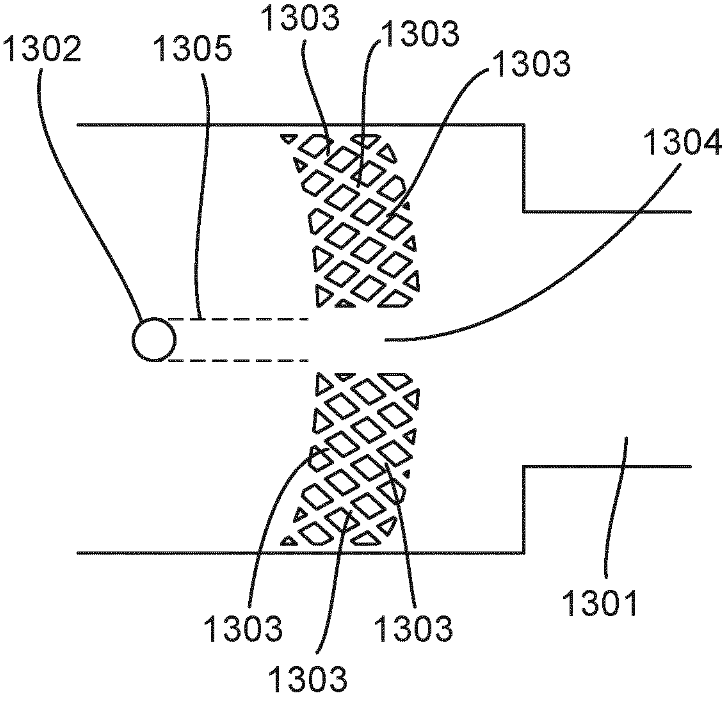

FIGS. 9A and 9B show, in plan view, part of a gripper 1301 according to implementations of a first embodiment.

A gripper 1301 according to an embodiment may comprise a main body with one or more engagement portions 1302 configured to engage with a surface of a substrate W. The gripper 1301 may comprise three engagement portions, as shown for the gripper 1201 in FIG. 8. The engagement portions 1302 may be the only points of contact between the substrate W and the gripper 1301. The substrate W may be located above the gripper 1301 so that the engagement portions 1302 contact the lower surface of the substrate W. Part of the upper surface of the gripper 1301 may be substantially planar and parallel with the lower surface of the substrate W. As explained later with reference to FIGS. 11A and 11B, the upper surface of the gripper 1301 may be separated from the lower surface of the substrate W by a gap 1501.

As shown in FIGS. 9A and 9B, there may be openings through at least part of the main body of the gripper 1301. At least part of the main body of the gripper 1301 may comprise a plurality of ribs 1303, 1304 arranged in a ribbed structure. The openings may be gaps between the ribs 1303, 1304. The openings may extend through the gripper 1301 is a direction parallel to the surface of the substrate W.

If any liquid falls from a substrate W onto the ribbed structure of the gripper 1301 according to an embodiment, some, or all, of the liquid may fall through the openings in the gripper 1301 and not onto the gripper 1301. Any liquid that falls onto the ribs 1303, 1304 may flow over the ribs and then fall from the gripper 1301. Advantageously, the amount of liquid collected on the outer surfaces of the gripper 1301 may be lower than with a known gripper 24, 1201 that does not comprise openings.

As shown in FIG. 8, residual liquid may mostly be present at the edge region 1203 of the substrate W. Embodiments include the part of the gripper 1301 that is overlapped by the edge region 1203 of the substrate W being a ribbed structure. As shown in FIGS. 9A and 9B, the rest of the main body of the gripper 1301 may be substantially the same as known designs of gripper. That is to say, only the part of the gripper 1301 that is overlapped by an edge region 1203 of a substrate W when the substrate W is secured to the gripper 1301 may comprise openings.

The ribs 1303, 1304 may be arranged in a skeleton, or mesh, type structure. FIGS. 9A and 9B show different arrangements of the ribs 1303, 1304 according to embodiments. Embodiments include any arrangement of the ribs 1303, 1304. For example, the ribs 1303, 1304 may be a plurality of parallel structures that do not join, or cross-over, each other. The ribs 1303, 1304 may be arranged in a single layer. Alternatively, the ribs 1301, 1304 may be arranged in a plurality of layers. For example, there may be two arrangements of the ribs 1303, 1304 as shown in FIG. 9A, with one of the arrangements positioned above the other.

Each of the ribs 1303, 1304 may comprise an at least partially coated outer surface. Embodiments include all of the outer surfaces of the ribs 1303, 1304 being coated. The coating may, for example, be hydrophobic. Alternatively, the coating may be hydrophilic.

Some of the ribs 1304 may also be fluid conduits. That is to say, the rib 1304 comprises a channel type structure for supporting a fluid flow through the rib 1304. The main body of the gripper 1301 may comprise one or more other fluid conduits 1305. Each fluid conduit 1305 may be in fluid communication with one or more of the engagement portions 1302. Each rib 1304 that is a fluid conduit in the ribbed structure may be in fluid flow with a fluid conduit 1305 that that is not part of the ribbed structure. The ribbed structure may also comprise one or more ribs 1303 that are not fluid conduits and only provide structural support. In the embodiments shown in the FIGS. 9A and 9B, the middle rib 1304 is a main fluid conduit through the ribbed structure. The middle rib 1304 may be the only fluid conduit in the ribbed structure and the other ribs 1303 may only provide structural support. The width/diameter of the middle rib 1304 may be larger than that of the other ribs 1303. Embodiments also include the gripper 1301 comprising a plurality of ribs 1304 that are all fluid conduits. When all of the ribs 1304 are fluid conduits, all of the ribs may be have substantially the same size and shape.

Figure 10A:
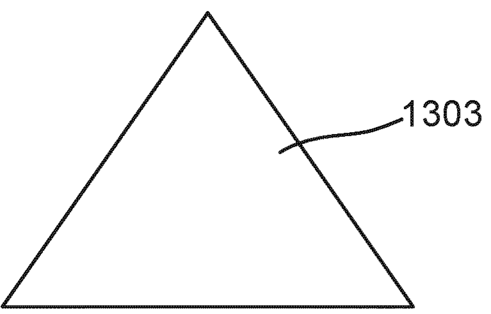
FIGS. 10A and 10B schematically show cross-sections through ribs according to embodiments.
Figure 10B:
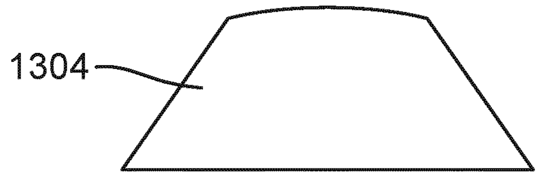

FIGS. 10A and 10B schematically show cross-sections through ribs 1303, 1304 according to embodiments. As shown in FIG. 10A, embodiments include one or more of the ribs 1303, 1304 having a substantially triangular cross-section. As shown in FIG. 10B, embodiments also include one or more of the ribs 1303, 1304 having a substantially trapezoidal cross-section. The corners/edges between each outer surface of the rib 1303, 1304 may be rounded. Each outer surface of a rib 1303, 1304 may be curved.

As described earlier, the gripper 1301 may comprise one or more engagement portions 1302. The gripper 1301 may comprise three engagement portions 1302 in the arrangement shown in FIG. 8. Each engagement portion 1302 may comprise a clamping device such as a clamping pad or a surface clamping pad. A surface clamping pad may be, for example, a vortex pad that allows to pull or push the substrate W by air pressure or pressure created by another medium. The air or other medium used for the clamping pads may be supplied or discharged through a number of fluid conduits in the main body of the gripper 1301. Each fluid conduit may be a vacuum conduit. The gripping and/or release of the substrate W by each engagement portion 1302 may be operated by controlling the fluid flow from and/or to the engagement portion 1302.

Embodiments also include the use of other types of surface clamping pads such as Bernoulli clamping pads or electrostatic clamping pads. At least when electrostatic clamping pads are used, there may be no fluid conduit to an engagement portion 1302 in the main body of the gripper 1301. However, some of the ribs 1303, 1304 may comprise one or more electrical cables for providing a power supply to the electrostatic clamping pads.

The clamping pads may be non-contact surface clamping pads, i.e. able to clamp the substrate W without mechanical contact between the surface clamping pad and the substrate W, or contact surface clamping pads, i.e. able to clamp the substrate W with mechanical contact between the surface clamping pad and the substrate W. Vortex pads may be of the non-contact type.

Figure 11A:
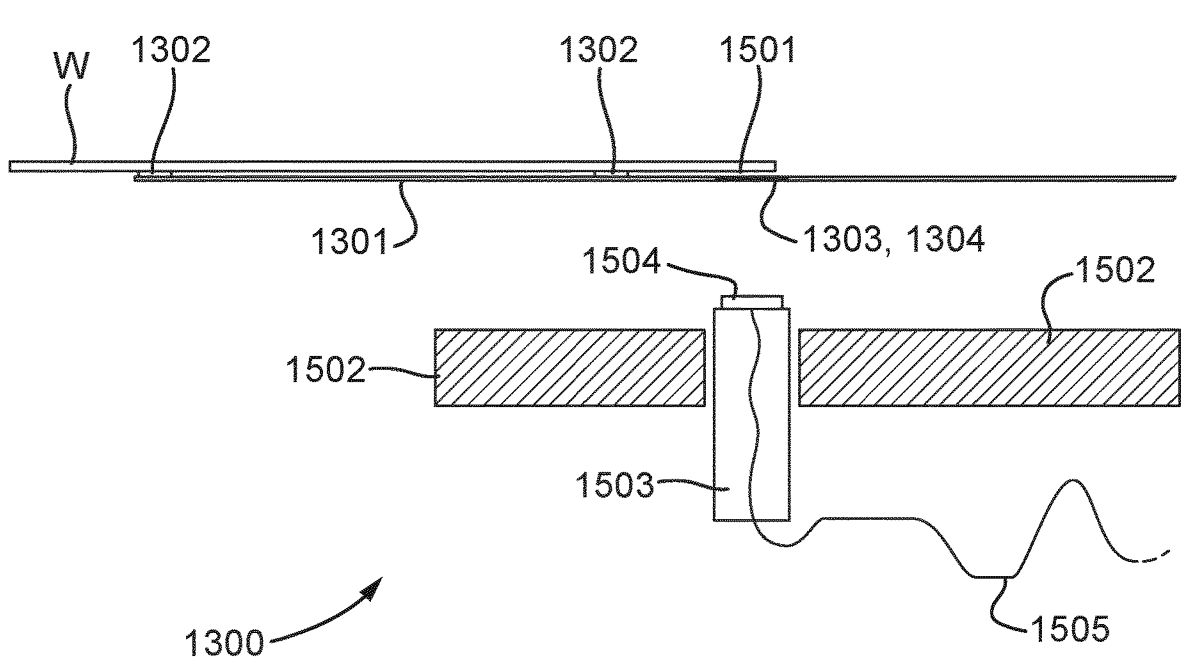
FIGS. 11A and 11B schematically show, in side view, a gripper system according to a second embodiment.
Figure 11B:
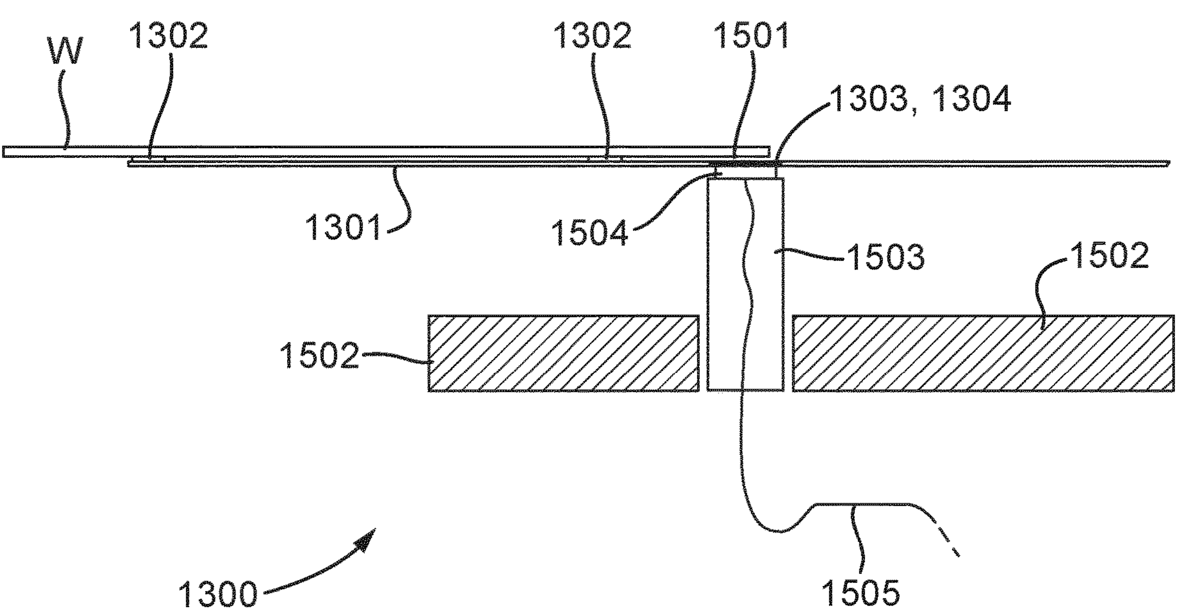

FIGS. 11A and 11B schematically show, in side view, a gripper system 1300 according to a second embodiment.

The gripper system 1300 according to the second embodiment may comprise any of the implementations of the gripper 1301 according to the first embodiment. The gripper system 1300 according to a second embodiment may also comprise a suction module 1503. The suction module 1503 may be located in a substrate handler frame 1502. The suction module 1503 may be located on an opposite side of the gripper 1301 to the substrate W.

As shown in FIG. 11A, the substrate W may be located above the gripper 1301 so that the engagement portions 1302 contact the lower surface of the substrate W. Part of the upper surface of the gripper 1301 may be substantially planar and parallel with the lower surface of the substrate W. The engagement portions 1302 may provide the only points of contact between the substrate W and the gripper 1301 so that the other parts of the upper surface of the gripper 1301 are separated from the lower surface of the substrate W by a gap 1501.

The suction module 1503 may comprise a fluid extraction conduit 1505. An end 1504 of the fluid extraction conduit 1505 may be configured to extract fluid from the surfaces of at least part of the gripper 1301.

The suction module 1503 may be moveable between a first position, as shown in FIG. 11B, and a second position, as shown in FIG. 11A. In the first position, the end 1504 of the fluid extraction conduit 1505 of the suction module 1503 is close to the lower surface of the gripper 1301. The end 1504 of the fluid extraction conduit 1505 may be arranged so that it is close to a part of the gripper 1301 that comprises ribs 1303, 1304. The end 1504 of the fluid extraction conduit

1505 may comprise a flexible part, such as a rubber part, so that it may contact the lower surface of the gripper 1301. The end 1504 of the fluid extraction conduit 1505 may be arranged to extract any fluid that is on the surfaces of the ribs 1303, 1304. The end 1504 of the fluid extraction conduit 1505 may be also be arranged to extract any fluid that is on the lower surface of the substrate W. As explained for the first embodiment, the part of the gripper 1301 that comprises ribs 1303, 1304 may be overlapped by the edge region 1203 of the substrate W when the gripper 1301 is engaged with the substrate W. The edge region 1203 of the substrate W may be where residual liquid is mostly present and the most likely part of the substrate W for a liquid droplet to fall from.

In the second position, the end 1504 of the fluid extraction conduit 1505 of the suction module 1503 is located further way from the gripper 1301 than when in the first position. In the second position, the suction module 1503 may be substantially retracted within the substrate handler frame 1502. When in the second position, the suction module 1503 may therefore not interfere with the movement of the gripper 1301, or any other aspect of the operation of the lithographic apparatus.

After a substrate W that may have residual liquid on it has been secured to, or removed from, the gripper 1301, the suction module 1503 may be moved from the second position to the first position. The suction module 1503 may then extract any liquid that is on the surfaces of the ribs 1303, 1304, and/or the lower surface of the substrate W. The suction module 1503 may then be moved from the first position back to the second position.

Advantageously, the suction module 1503 may substantially remove any liquid that is on the surfaces of the ribs 1303, 1304, and/or the lower surface of the substrate W. By removing any liquid that is transferred from a substrate W onto surfaces of the ribs 1303, 1304 of the gripper 1301, the liquid will not be transferred onto another substrate W secured to the gripper 1301.

Embodiments include a number of modifications and variations to the techniques described above.

In particular, the openings through the gripper 1301 are not restricted to only being through the part of the gripper 1301 that is overlapped by the edge region 1203 of a substrate W when the substrate W is secured to the gripper 1301. Embodiments include substantially all parts of the gripper 1301, that are overlapped by any part of the substrate W, comprising openings. The openings may extend through the gripper 1301 in a direction substantially perpendicular to the plane of the substrate W. Substantially all of the gripper 1301 structure that is overlapped by any part of the substrate W may comprise ribs 1303, 1304 arranged in a skeleton, or mesh, type structure. In a direction perpendicular to the plane of the substrate W, the ribs 1303, 1304 may be arranged in a single layer or in a plurality of layers.

Embodiments also include substantially the entire gripper 1301 comprising openings, including the parts of the gripper 1301 that are not overlapped by the substrate W. The openings may extend through the gripper 1301 in a direction substantially perpendicular to the plane of the substrate W. Substantially all of the gripper 1301 structure may comprise ribs 1303, 1304 arranged in a skeleton, or mesh, type structure. In a direction perpendicular to the plane of the substrate W, the ribs 1303, 1304 may be arranged in a single layer or in a plurality of layers as previously described.

The gripper 1301 according to the first embodiment, and/or the gripper system 1300 according to the second embodiment, may form a part of a substrate handler (not depicted in figures). The substrate handler may include the substrate handler frame 1502 of the second embodiment.

Embodiments also include a lithographic apparatus. The lithographic apparatus may have any/all of the other features or components of the lithographic apparatus as described above. For example, the lithographic apparatus may optionally comprise at least one or more of a source SO, an illumination system IL, a projection system PS, a substrate table WT, etc. Specifically, the lithographic apparatus may comprise the projection system PS configured to project the radiation beam B towards the region of the surface of a substrate W. The lithographic apparatus may further comprise the gripper 1301, and/or gripper system 1300, as described in any of the above embodiments and variations.

The lithographic apparatus may comprise an actuator configured to move the substrate W relative to the fluid handling system. Thus, the actuator may be used to control the position of the substrate W (or alternatively, the position of the fluid handling system). The actuator could be, or could comprise, the substrate table WT and/or a substrate holder constructed to hold the substrate W and/or the second positioner PW configured to accurately position the substrate table WT.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate W) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Embodiments include the following numbered clauses:

1. A gripper configured to transport a substrate in a lithographic apparatus, the gripper comprising: a main body with one or more engagement portions for engaging with a surface of the substrate; wherein a part of the main body, that is overlapped by a region of a substrate when the one or more engagement portions are engaged with the substrate, comprises a plurality of openings that extend through the main body in a direction substantially perpendicular to the surface of the substrate.
2. The gripper according to clause 1, wherein the part of the main body is overlapped by an edge region of the substrate when the one or more engagement portions are engaged with the substrate.
3. The gripper according to clause 1 or 2, wherein the part of the main body that is overlapped by the region of the substrate comprises a plurality of ribs; and said plurality of openings are arranged between the ribs.
4. The gripper according to clause 3, wherein the ribs are arranged in a skeleton type structure.
5. The gripper according to any of clauses 3 or 4, wherein one or more of the ribs comprises an at least partially coated outer surface.
6. The gripper according to clause 5, wherein the coating is hydrophobic or hydrophilic.
7. The gripper according to any of clauses 3 to 6, wherein one or more of the ribs comprises a curved outer surface.
8. The gripper according to any of clauses 3 to 7, wherein one or more of the ribs comprises rounded edges between its outer surfaces.
9. The gripper according to any preceding clause, wherein the engagement portions comprise clamping pads, such as vortex or electrostatic clamping pads.
10. The gripper according to any preceding clause, further comprising one or more conduits in the main body for providing a fluid flow from and/or to each of the engagement portions so as to operate the gripping and/or release of the substrate by each of the one or more engagement portions.
11. The gripper according to clause 10, wherein the one or more conduits comprise vacuum conduits.
12. The gripper according to clause 10 or 11, wherein the fluid flow through the one or more conduits is an air flow.
13. The gripper according to any of clauses 10 to 12, when dependent on clause 3, wherein, in the part of the main body that is overlapped by the region of the substrate, there is a main conduit for providing the substantial fluid flow to the engagement portions.
14. The gripper according to clause 13, wherein the width/diameter of the main conduit is larger than that of the ribs.
15. The gripper according to any of clauses 10 to 14, when dependent on clause 3, wherein a plurality of the ribs are conduits for the fluid.
16. The gripper according to any preceding clause, wherein, when the one or more engagement portions are engaged with the substrate, the substrate is located above the gripper.
17. The gripper according to any preceding clause, wherein, when the one or more engagement portions are engaged with the substrate, there is a gap between the part of the gripper body that is overlapped by the edge region of the substrate and the substrate.
18. A gripper system comprising: a gripper according to any preceding clause; and a suction module; wherein the suction module comprises a fluid extraction conduit configured to extract fluid from the surfaces of a part of the gripper.
19. The gripper system according to clause 18, wherein the part of the gripper is overlapped by an edge region of a substrate when the gripper is engaged with the substrate.
20. The gripper system according to clause 18 or 19, wherein, when the gripper is engaged with the substrate, the suction module is arranged on the opposite side of the gripper to the substrate.
21. The gripper system according to any of clauses 18 to 20, wherein the suction module is arranged to move between a first position and a second position; in the first position, an end of the fluid extraction conduit of the suction module is close to the gripper and arranged to extract fluid from the surfaces of the gripper; and in the second position, the end of the fluid extraction conduit of the suction module is located further way from the gripper than when in the first position.
22. A substrate handler comprising the gripper system according to any of clauses 18 to 21.
23. A lithographic apparatus comprising the substrate handler according to clause 22.

The descriptions above are intended to be illustrative, not limiting. Thus, it will be apparent to one skilled in the art that modifications may be made to the invention as described without departing from the scope of the claims set out below.

The invention claimed is:

1. A gripper configured to transport a substrate in a lithographic apparatus, the gripper comprising:

a main body with one or more engagement portions for engaging with a major surface of the substrate, the one or more engagement portions all located fully within an outer peripheral edge of the substrate when the one or more engagement portions are engaged with the major surface of the substrate;

wherein a part of the main body comprises a plurality of openings that extend through the main body in a direction substantially perpendicular to the surface of the substrate, wherein the openings are at least partly overlapped by an edge region of a substrate when the one or more engagement portions are engaged with the substrate, and wherein, when the one or more engagement portions are engaged with the major surface of the substrate, at least one of the openings is located, in a direction outward from a central portion of the main body, between 1) an engagement portion, of the one or more engagement portions, that is nearest the edge of the substrate and 2) the edge of the substrate.

2. The gripper according to claim 1, wherein the part of the main body comprises a plurality of ribs and the plurality of openings are arranged between the ribs.

3. The gripper according to claim 2, wherein the ribs are arranged in a skeleton type structure and/or wherein one or more of the ribs comprises an at least partially coated outer surface, and/or wherein one or more of the ribs comprises a curved outer surface, and/or wherein one or more of the ribs comprises rounded edges between its outer surfaces.

4. The gripper according to claim 3, wherein one or more of the ribs comprises an at least partially coated outer surface and the coating is hydrophobic or hydrophilic.

5. The gripper according to claim 2, wherein, in the part of the main body, there is a main conduit for providing substantial fluid flow to the engagement portions, and/or wherein a plurality of the ribs are conduits for a fluid flow from and/or to the engagement portions.

6. The gripper according to claim 5, comprising the main conduit and wherein a width/diameter of the main conduit is larger than that of the ribs.

7. The gripper according to claim 1, wherein the engagement portions comprise clamping pads and/or wherein, when the one or more engagement portions are engaged with the substrate, the substrate is located above the gripper, and/or wherein, when the one or more engagement portions are engaged with the substrate, there is a gap between the part of the main body and the substrate.

8. The gripper according to claim 1, further comprising one or more conduits in the main body for providing a fluid flow from and/or to each of the engagement portions so as to operate gripping and/or release of the substrate by each of the one or more engagement portions.

9. The gripper according to claim 8, wherein the one or more conduits comprise vacuum conduits, and/or wherein the fluid flow through the one or more conduits is an air flow.

10. A gripper system comprising:

the gripper according to claim 1; and a suction module, wherein the suction module comprises a fluid extraction conduit configured to extract fluid from surfaces of a part of the gripper.

11. The gripper system according to claim 10, wherein the part of the gripper is overlapped by the edge region of the substrate when the gripper is engaged with the substrate.

12. The gripper system according to claim 10, wherein, when the gripper is engaged with the substrate, the suction module is arranged on the opposite side of the gripper to the substrate.

13. The gripper system according to claim 10, wherein the suction module is arranged to move between a first position and a second position, wherein:

in the first position, an end of the fluid extraction conduit of the suction module is close to the gripper and arranged to extract fluid from the surfaces of the gripper; and in the second position, the end of the fluid extraction conduit of the suction module is located further way from the gripper than when in the first position.

14. A substrate handler comprising the gripper system according to claim 10.

15. A lithographic apparatus comprising the substrate handler according to claim 14.

16. A gripper configured to transport a substrate in a lithographic apparatus, the gripper comprising:

a main body with one or more engagement portions for engaging with a surface of the substrate;

wherein a part of the main body comprises:

a plurality of openings that extend through the main body in a direction substantially perpendicular to the surface of the substrate and the plurality of openings are enclosed by a main body structure, and a plurality of ribs arranged to connect a first part of the enclosing main body structure with a second part of the enclosing main body structure, wherein at least one of the openings is arranged adjacent or between the ribs, wherein the openings and ribs are overlapped by an edge region of a substrate when the one or more engagement portions are engaged with the substrate, and wherein, when the one or more engagement portions are engaged with the major surface of the substrate, at least one of the openings is located, in a direction outward from a central portion of the main body, between 1) an engagement portion, of the one or more engagement portions, that is nearest the edge of the substrate and 2) the edge of the substrate.

17. The gripper according to claim 16, wherein the ribs are arranged in a skeleton type structure, and/or wherein one or more of the ribs comprises a curved outer surface, and/or wherein one or more of the ribs comprises rounded edges between its outer surfaces.

18. The gripper according to claim 16, wherein one or more of the ribs comprises an at least partially coated outer surface and the coating is hydrophobic or hydrophilic.

19. The gripper according to claim 16, further comprising one or more conduits in the main body for providing a fluid flow from and/or to each of the engagement portions so as to operate gripping and/or release of the substrate by each of the one or more engagement portions.

20. A gripper system comprising:

the gripper according to claim 16; and a suction module, wherein the suction module comprises a fluid extraction conduit configured to extract fluid from surfaces of a part of the gripper.

21. A gripper configured to transport a substrate in a lithographic apparatus, the gripper comprising:

a main body with one or more engagement portions for contacting with a major surface of the substrate such that there is a gap between the main body and the substrate when the one or more engagement portions are engaged with the substrate and the one or more engagement portions all located fully within an outer peripheral edge of the substrate when the one or more engagement portions are engaged with the substrate, wherein a part of the main body, that is at least partly overlapped by an edge region of the substrate when the one or more engagement portions are engaged with the substrate, comprises a plurality of openings that extend through the main body in a direction substantially perpendicular to the surface of the substrate, and wherein, when the one or more engagement portions are engaged with the major surface of the substrate, at least one of the openings is located, in a direction outward from a central portion of the main body, between 1) an engagement portion, of the one or more engagement portions, that is nearest the edge of the substrate and 2) the edge of the substrate.

* * * * *